US006316333B1

(12) United States Patent
Bruel et al.

(10) Patent No.: US 6,316,333 B1
(45) Date of Patent: Nov. 13, 2001

(54) METHOD FOR OBTAINING A THIN FILM IN PARTICULAR SEMICONDUCTOR, COMPRISING A PROTECTED ION ZONE AND INVOLVING AN ION IMPLANTATION

(75) Inventors: Michel Bruel, Veurey; Bernard Aspar, Rives, both of (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/341,555

(22) PCT Filed: Jan. 26, 1998

(86) PCT No.: PCT/FR98/00129

§ 371 Date: Jul. 14, 1999

§ 102(e) Date: Jul. 14, 1999

(87) PCT Pub. No.: WO98/33209

PCT Pub. Date: Jul. 30, 1998

(30) Foreign Application Priority Data

Jan. 27, 1997 (FR) .................................................. 97 00837

(51) Int. Cl.[7] .................................................. H01L 21/30
(52) U.S. Cl. ........................... 438/458; 438/586; 438/455
(58) Field of Search .................................... 438/458, 586, 438/455, 483, 233, 234, 235, 225, 448, 449, 296, 297, 464, 585, 152, 153, 154, 301, 302, 303, 304

(56) References Cited

U.S. PATENT DOCUMENTS

| 4,375,717 | * | 3/1983 | Tunnel | 29/571 |
|---|---|---|---|---|
| 4,887,238 | * | 12/1989 | Bergemont | 365/185 |
| 5,246,882 | * | 9/1993 | Hartmann | 437/195 |
| 5,354,695 | * | 10/1994 | Leedy | 437/7 |
| 5,374,564 | * | 12/1994 | Bruel | 437/24 |
| 5,654,242 | * | 8/1997 | Komatsu | 438/585 |
| 5,714,412 | * | 2/1998 | Brigham et al. | 438/301 |
| 5,888,853 | * | 6/1999 | Gardner et al. | 438/152 |
| 5,913,136 | * | 6/1999 | Deleonibus | 438/586 |
| 5,973,365 | * | 10/1999 | Deleonibus | 257/349 |
| 6,083,324 | * | 7/2000 | Henley et al. | 148/33.2 |
| 6,093,623 | * | 7/2000 | Forbes | 438/455 |
| 6,146,979 | * | 11/2000 | Henley | 438/458 |
| 6,171,982 | * | 1/2001 | Sato | 438/795 |
| 6,242,298 | * | 6/2001 | Kawakubo | 438/239 |

FOREIGN PATENT DOCUMENTS

59055070 * 6/1984 (JP) ...................................... 438/155

* cited by examiner

Primary Examiner—Charles Bowers
Assistant Examiner—Laura M Schillinger
(74) Attorney, Agent, or Firm—Burns Doane Swecker & Mathis LLP

(57) ABSTRACT

The invention relates to a process for obtaining a thin film from a substrate, the film being delimited in the substrate by ionic implantation and by heat treatment inducing a fracture line along which the film can be separated from the rest of the substrate. A particular area, for example composed of a gate oxide layer (15) and the channel area (19) of a MOS transistor (12) created in the substrate region (10) intended to form the tin film (20), this area may be protected by ionic implantation by masking using the transistor gate (16), which does not prevent the fracture from occurring provided that the width of the area does not exceed a limiting dimension determined for the material forming the substrate.

10 Claims, 3 Drawing Sheets

METHOD FOR OBTAINING A THIN FILM IN PARTICULAR SEMICONDUCTOR, COMPRISING A PROTECTED ION ZONE AND INVOLVING AN ION IMPLANTATION

TECHNICAL DOMAIN

This invention relates to a process for obtaining a thin film, comprising an area protected from ions, involving an ionic implantation step. In particular it relates to obtaining a semiconducting thin film in which active layers are created, for example to create MOS transistor channel areas.

STATE OF PRIOR ART

In the subject of semiconductors, it is sometimes necessary to make semiconducting thin films, for example to make "Silicon On Insulator" substrates. Other methods of making thin semiconducting films have been developed. One of the most recent methods is based on the fact that implantation of ions of a rare gas or hydrogen in a semiconducting material induces the formation of brittle zones at a depth close to the average ion penetration depth. Document FR-A-2 681 472 divulges a process that uses this property to obtain a thin film of semiconducting material. This process consists of applying the following steps to a platelet of the required semiconducting material and comprising a plane face:

a first implantation step by bombarding the plane face of the platelet using ions capable of creating a layer of "gaseous microbubbles" within the thickness of the platelet at a depth close to the average ion penetration depth, this layer separating the platelet into a lower region containing the mass of the substrate and an upper region forming the thin film, the chosen ions being either rare gas ions or hydrogen gas ions;

a second step in which the plane surface of the platelet is put into intimate contact with a support (or stiffener) composed of at least one layer of rigid material, this intimate contact possibly being made by means of an adhesive substance, by the effect of prior preparation of surfaces and heat and/or electrostatic treatment to encourage interatomic bond between the support and the platelet;

a third heat treatment step of the platelet and support assembly at a temperature greater than the temperature at which the implantation was carried out and sufficient to create a separation between the thin film and the substrate mass. This temperature is about 400° C. for silicon.

This document proposes the following explanation for the various phenomena observed by experience. Firstly, the first ionic implantation step is carried out by presenting a plane surface of a semiconducting material platelet to an ion beam, the plane of this plane surface being either approximately parallel to a principal crystallographic plane in the case in which the semiconducting material is perfectly monocrystalline, or more or less inclined with respect to a principal crystallographic plane with the same indexes for all grains in the case in which the material is polycrystalline. This implantation can create a layer of gaseous microbubbles that will create a fracture zone at the end of the heat treatment. This layer of microbubbles thus created within the thickness of the platelet is at a depth close to the average ion penetration depth and delimits two regions within the platelet separated by this layer; the first region will form the thin film and the second region will form the rest of the substrate. The expression "gaseous microbubbles" means any cavity or micro-cavity generated by the implantation of hydrogen gas or rare gas ions in the material. The cavities may be either in a very flattened form, in other words with low height, for example of the order of a few inter-atomic distances, or they may be in approximately hemispherical form or in any other form different from the two forms mentioned above. These cavities may or may not contain a gaseous phase. During the third step, the heat treatment is carried out at a sufficiently high temperature to create the fracture zone and separation between the two regions, as a result of crystalline rearrangement in the semiconducting material, for example such as by the effect of micro-cavity growth and/or pressure in the microbubbles.

Depending on the implantation conditions, the cavities or microbubbles may or may not be observable after the implantation of a gas, for example such as hydrogen, using transmission electronic microscopy. In the case of silicon, there may be micro-cavities with a size varying from a few nm to a few hundred nm. Thus in particular, when the implantation temperature is low, these cavities can only be observed during the heat treatment step during which nucleation is achieved for example by means of a fast increase in temperature in order to terminate the fracture between the thin film and the rest of the substrate at the end of the heat treatment.

Furthermore, it appears that this process may be applicable to all types of crystalline or non-crystalline solid materials. This process can be applied to dielectric, conducting, semi-insulating materials, and amorphous semiconducting materials.

It may be useful if the thin film obtained comprises some elements or specific features that were generated when this film still formed part of its initial substrate. It is thus possible to make a three-dimensional structure by superposition of thin films. In the micro-electronics domain, this means that platelets can be obtained made by stacking thin semiconducting films, comprising electronic components in the three dimensions of space. However, the implantation of ions through electrically active layers may create defects that modify the characteristics of the components, or make them unusable. This is the case particularly for channel areas and grid oxide layers in MOS transistors.

DESCRIPTION OF THE INVENTION

Thus, the process divulged by document FR-A-2 681 472, which is technically very interesting, had limitations in some of these applications. The inventors of this patent have found a solution to this problem. They have discovered that under some conditions, a masking technique can be used to protect areas sensitive to the transfer of ions, which implies an absence of micro-cavities in the areas corresponding to the masked areas, and nevertheless obtaining cleavage in the substrate so that a thin film can be detached, This is possible if the width of each masked area does not exceed a limiting dimension determined for the material making up the substrate. This principle can also be applied to structures in which elements have been made before implantation, these elements masking areas of the substrate that are not necessarily sensitive to the implantation. In this case, the purpose of the invention is to make these elements significantly narrower than or equal to the limiting dimension.

Therefore, the purpose of the invention is a process for obtaining a thin film starting from a substrate made of a determined material, this thin film being composed of a region of the substrate adjacent to one of its faces and separated from the rest of the substrate, at least one structure being created from the said region, the process comprising the following steps:

generation of the said structure until at least two superposed areas making up the structure are obtained, the upper area acting as a means of masking the lower area by defining a width of the masked area in the substrate not exceeding a determined limiting dimension for the material of the said substrate, ionic implantation of the substrate through the said surface of the substrate, capable of creating a layer of micro-cavities within the thickness of the substrate and at a depth close to the average ion penetration depth, delimiting the said region within the substrate except for an area corresponding to the masked area, heat treatment at a sufficiently high temperature to make a fracture line along this layer of micro-cavities, this fracture line being either continuous if the width of the masked area is sufficiently small compared with the said limiting dimension, or discontinuous if the width of the masked area is not sufficiently small with respect to the said limiting dimension, separation of the thin film from the rest of the substrate either by simple separation if the fracture line is continuous, or by the application of mechanical forces between the said region and the rest of the substrate if the fracture line is discontinuous. This latter case means that there are solid bridges between the fracture lines.

Another step may be included between the ionic implantation step and the heat treatment step, in which the substrate is rigidly bonded to a stiffener, on the side of the said region that will form the thin film.

Ionic implantation may be done using hydrogen ions or rare gas ions.

Preferably, the mechanical forces are bending and/or tension forces. They may be applied during or after the heat treatment step.

For example, masking means may consist of a layer deposited on the said substrate surface.

If the substrate is a semiconducting substrate, the structure may form an electronic component. This electronic component may be a transistor, the upper area comprising the transistor gate.

In particular, the invention is applicable to the case in which the semiconducting substrate made of silicon, in which the electronic component is a MOS transistor and in which the said lower area is the gate oxide layer and the channel area of this MOS transistor. The upper area may then advantageously comprise the polysilicon gate of the MOS transistor deposited on the gate oxide layer, or it may consist entirely of this gate. In addition to the polysilicon, gate, masking means may comprise a layer made of resin or any other material deposited on the flanks of the gate. An important advantage of this is that relatively large transistors may be obtained since the width of the masked area only corresponds to the width of the gate, possibly with its flanks.

By proceeding this way, it may be necessary to make the ionic implantation in an heterogeneous medium, for example in the semiconducting substrate and through doped regions making up the drain and source areas. This goes against standard practice applied by an expert in the subject who would completely mask the various active regions of a component, in other words including the drain and source of a transistor, before making the ionic implantation. The inventors of this invention discovered that the area corresponding to the gate oxide, rather than source and drain areas, is very sensitive to ionic implantation. An ionic implantation through the source and drain areas induces some disturbances in the transistor characteristics. However, these disturbances are acceptable for operation of the transistor.

The transistor gate acts as a mask for the sensitive area during the implantation, consequently there is no need to add an additional masking step in the process to obtain a thin film.

Note also that the source and drain regions may be formed after the ionic implantation step.

The medium in which ionic implantation is done can also be composed of different materials, both in a dimension parallel to the implantation beam and in a direction perpendicular to it. Thus, despite the heterogeneity of the medium, the substrate can be fractured even with areas masked from the ion beam. When materials are heterogeneous and/or the surface topology of the substrate is heterogeneous, the fracture propagates not only in a plane, but undulations may be observed depending on the differences in the position of implanted ions due to a difference between the stopping power of the various materials with respect to these ions.

BRIEF DESCRIPTION OF THE DRAWINGS

The invention will be better understood and other advantages and specific features will become clear after reading the following description given as a non-restrictive example and accompanied by the attached figures in which.

DETAILED DESCRIPTION OF EMBODIMENTS OF THE INVENTION

In order to simplify the description, it will be assumed that the implantation is done under conditions such that micro-cavities can be observed after implantation and that masking is done above an area sensitive to implantation.

Figure 1:
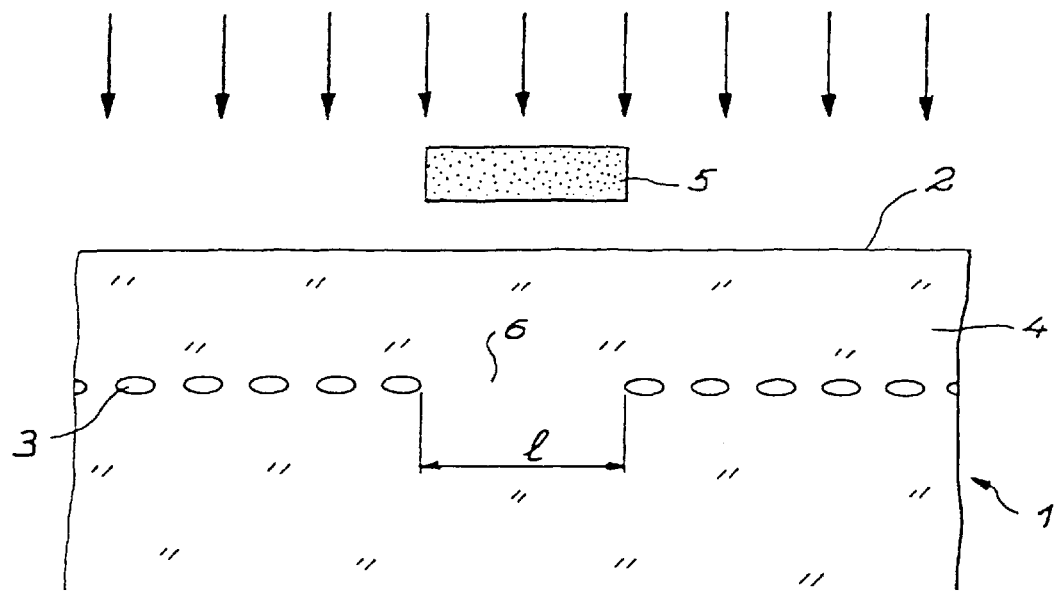
FIG. 1 is side view of a substrate in which an ion implantation has been carried out.

FIG. 1 shows a cross-sectional view of a substrate 1, for example made of monocrystalline silicon of electronic quality and with a plane surface 2. Substrate 1 is subjected to ionic bombardment shown by arrows, through the plane surface 2. For example, the implanted ions may be protons. The energy supplied to the ions and their dose is determined so as to obtain a layer of micro-cavities 3 within the thickness of substrate 1 located at a determined depth from the plane surface 2. Document FR-A-2 681 472 gives information about the ion energy and implantation dose to obtain a layer of micro-cavities at a given level. The micro-cavities layer 3 delimits an area 4 in the substrate. A subsequent heat treatment at an appropriate temperature, for example of the order of 400° C., transforms the layer of micro-cavities into micro-cracks inducing a fracture line enabling separation of the region 4, which becomes a thin film, from the rest of the substrate.

FIG. 1 shows a mask 5 inserted between the ion beam creating the ionic implantation and face 2 of substrate 1. This mask is sufficiently thick to stop ions that reach it. Consequently, the micro-cavities layer 3 is interrupted in an area 4 corresponding to mask 5, and the part of the substrate between the plane surface 2 and area 6 is not disturbed by ionic implantation.

Unlike what might be expected, it appeared that, under some conditions, this discontinuity in the micro-cavities layer does not prevent propagation of microcracks within the micro-cavities layer during the heat treatment step. The propagation of micro-cracks depends on the value of the width l of the masked area 6 during implantation.

For example, in the case of a monocrystalline silicon substrate, if the width l of the masked area 6 is less than 0.8 μm, the fracture may propagate between the micro-cavities located on each side of the masked area. If the width l of the masked area 6 exceeds 0.8 μm but remains less than a given limiting width, the crack may be propagated by means of mechanical forces, for example bending or tension, applied between region 4 and the rest of the substrate in order to separate them during or after the heat treatment, without mechanically altering the thin film obtained.

Therefore the limiting width for a given substrate material is the maximum width of a masked area that enables the thin film to be detached without mechanical alteration damaging to this film. This limiting width also depends on the size and density of cracks induced in the substrate and therefore parameters that determine these cracks (implantation energy and dose, temperature of the heat treatment).

Note that this width l, which corresponds to the width of the masked area, may be significantly different from the width over which micro-cavities are missing. In fact, the beam is not perfectly parallel in the case of an ionic implantation, but may be convergent or divergent depending on implantation conditions. Furthermore, the position of an ion implanted in a material is random and statistical and depends on the sequence of collisions encountered by the ion. For example in the case of hydrogen implanted in amorphous silicon at 120 keV, the lateral standard deviation as defined and calculated in the Gibbons Tables is equal to 0.2596 μm.

Figure 2:
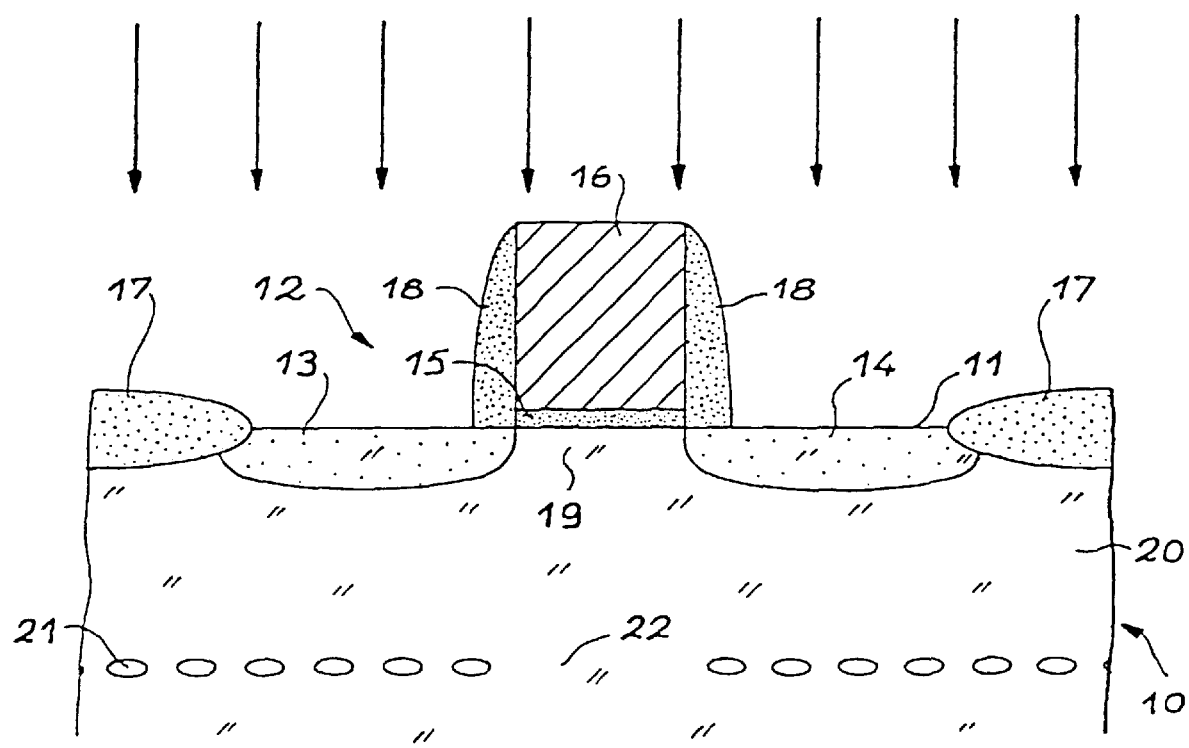
FIG. 2 is a cross-sectional view of a silicon substrate in which a MOS transistor has been prepared and in which the process according to the invention is applied.

In the example shown in FIG. 2, the substrate 10 is a board of P doped monocrystalline silicon. A MOS transistor 12 was produced on a plane surface 11 of this substrate. This transistor 12 comprises a source 13 consisting of an n+ doped region and a drain 14 also composed of an n+ doped region. A silicon oxide layer 15 was formed on the surface 11 of the substrate between the source 13 and the drain 14. The oxide layer 15 was covered by a polycrystalline silicon gate 16. The transistor 12 was completed by surrounding it with a thermal oxide layer 17, and by providing silicon nitride spacers 18 on the flanks of gate 16.

The gate oxide layer 15 and the subjacent channel area 19 form a sensitive area since these layers may be disturbed by the passage of implanted compounds. According to this invention, this sensitive area may be protected during the ionic implantation step by the gate 16 that covers them, this gate being sufficiently thick to prevent implanted ions from reaching the oxide layer 15. Spacers may also participate in this protection.

The ionic implantation step is shown by arrows in FIG. 2. Ionic implantation induces a layer of micro-cavities 21 delimiting a region 20 corresponding to the thin film, and with a discontinuity formed by area 22 masked from the ion beam. As mentioned above, if the width of the masked area is less than the limiting width resulting from the semiconducting material and implantation and heat treatment conditions, the thin film 20 may be separated from the substrate with or without applied mechanical forces depending on the width of the area 22. For example, a 0.5 μm wide gate 16 does not prevent propagation of micro-cracks in the fracture plane under normal conditions of use of the process divulged in document FR-A-2 681 472.

FIGS. 3A to 3D illustrate a variant application of the process according to this invention. These figures are also cross-sectional views, like FIG. 2.

Figure 3A:
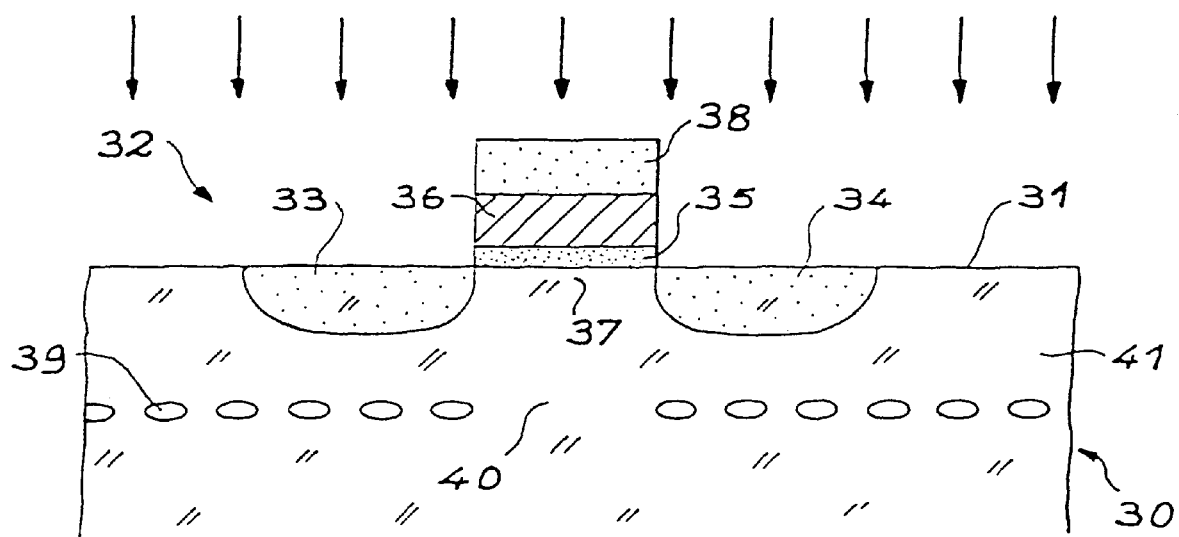
FIGS. 3A to 3D illustrate application of the process according to the invention to the transfer of a thin silicon film comprising a MOS transistor from its initial substrate to another support element.

FIG. 3A shows a p doped monocrystalline silicon substrate 30. MOS transistor 32 has been produced on the plane surface 31 of this substrate. The MOS transistor comprises an n+ doped source 33 region, and an n+ doped drain 34 region, a gate oxide layer 35, a polycrystalline silicon gate 36, and a channel area 37. In this variant, it was considered necessary to deposit a resin layer 38 on gate 36 to give good masking of the sensitive area of the MOS transistor. The ionic implantation represented by arrows causes the creation of a layer of micro-cavities 39 in the thickness of the substrate except for the area 40 masked from ionic implantation. The width of this masked area corresponding to the width of gate 36, is less than the limiting width so that the process according to the invention can be used. This defines a region 41 in which the thin film will be formed between the plane face 31 and the micro-cavities layer 39.

Figure 3B:
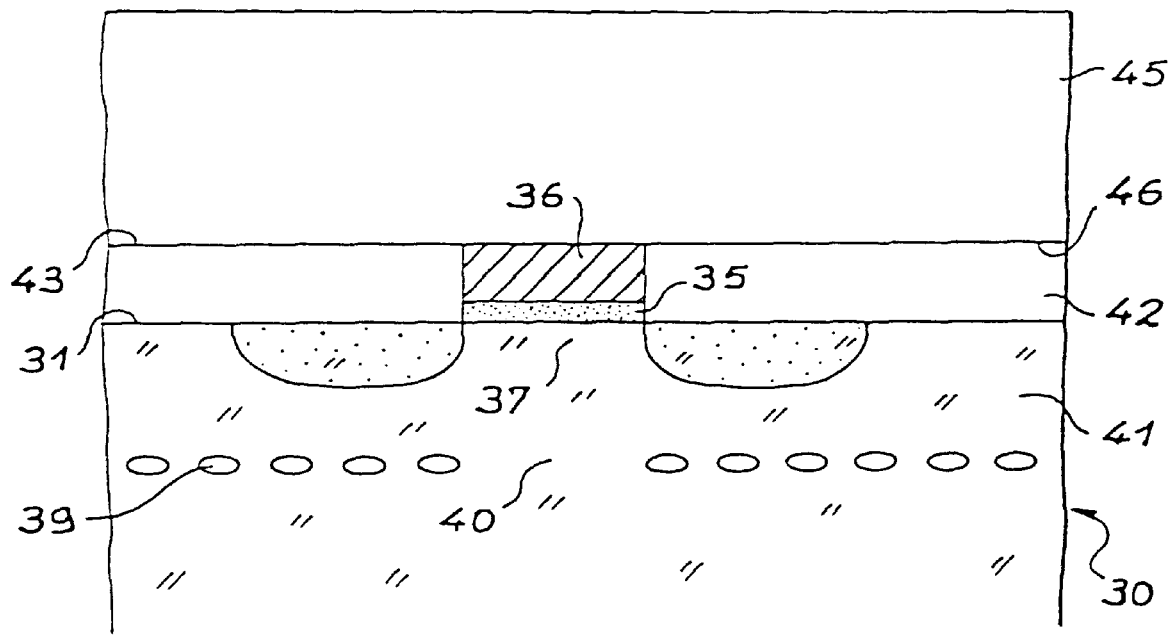

Once the ionic implantation step has been completed, the resin layer 38 is removed and an $SiO_2$ oxide layer is formed on the plane surface 31 of the substrate 30, as far as the upper layer of the gate 36 in order to obtain a plane surface 43 that will form the upper surface of the thin film (see FIG. 3B). A plate 45, acting as a stiffener and with a plane surface 46 is rigidly fixed to the upper surface of the thin film, for example by means of the "Wafer Bending" technique to bond plane surfaces 43 and 46 to each other, in other words bonding by molecular adhesion.

Figure 3C:
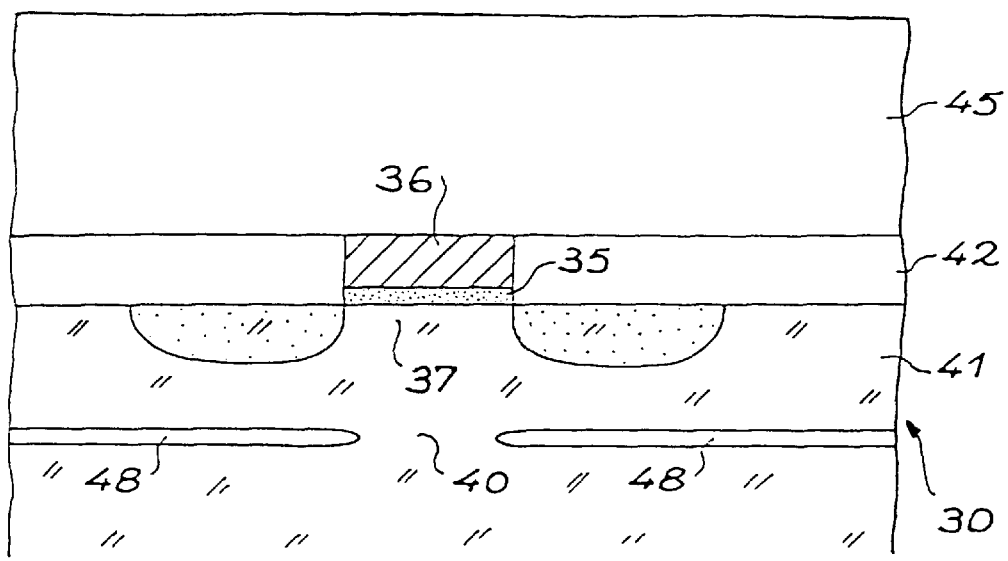

FIG. 3C shows the composite structure made previously after the heat treatment step. As mentioned above, the consequence of this heat treatment step is to transform the micro-cavities layer into micro-cracks. It is then possible to obtain either a continuous fracture line if the width of the masked area is sufficiently small compared with the previously defined limiting width, or a discontinuous fracture line if the width of the masked area is not small enough compared with the limiting width. This is the case shown in FIG. 3C in which the line of micro-cracks 48 is interrupted in the masked area 40.

Figure 3D:
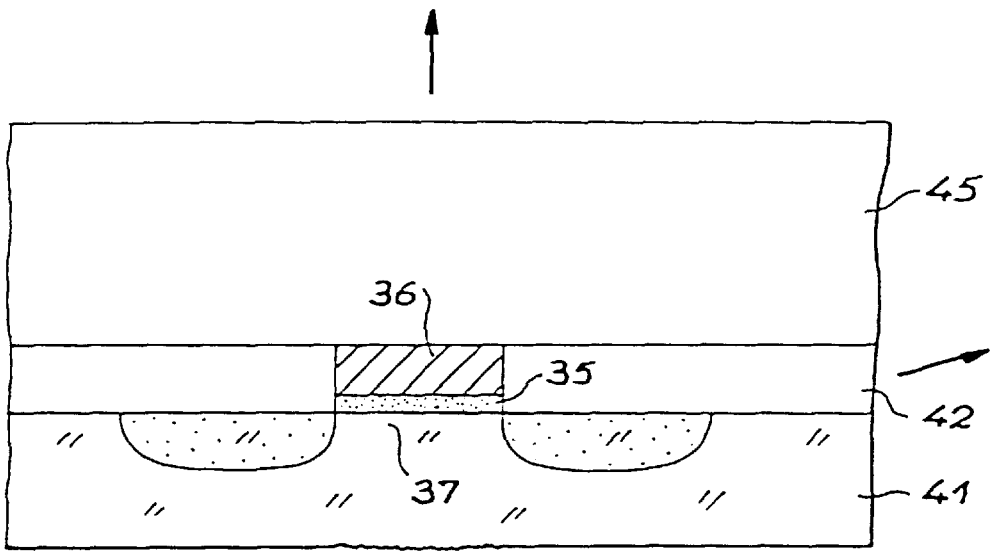
Figure 3D:
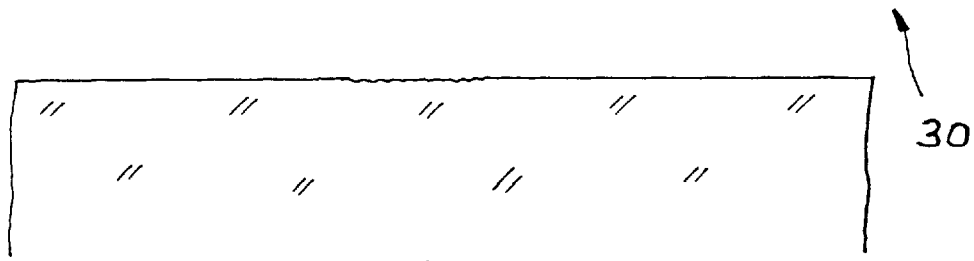

The separation of the substrate into two parts on each side of the micro-cracks line is obtained by the application of mechanical forces. This is what is shown in FIG. 3D in which mechanical forces are symbolized by arrows.

What is claimed is:

1. Process for obtaining a thin film starting from a semiconducting substrate, this thin film being composed of a region of the substrate adjacent to one of its faces and separated from the rest of the substrate, at least one transistor being created from the said region, the process comprising the following steps:

generation of the said transistor until at least two superposed areas making up the transistor are obtained, the upper area including the transistor gate acting as a means of masking the lower area by defining a width of the masked area in the substrate not exceeding a determined limiting dimension for the material of the said substrate, ionic implantation of the substrate through the said surface of the substrate, capable of creating a layer of micro-cavities within the thickness of the substrate and at a depth close to the average ion penetration depth, delimiting the said region from the rest of the substrate except for an area corresponding to the masked area, heat treatment at a sufficiently high temperature to make a fracture line along this layer of micro-cavities, this fracture line being either continuous if the width of the masked area is sufficiently small compared with the said limiting dimension, or discontinuous if the width of the masked area is not sufficiently small with respect to the said delimiting dimension, cleavage of the thin film from the rest of the substrate, either by simple separation if the fracture line is continuous, or by the application of mechanical forces between the said region and the rest of the substrate if the fracture line is discontinuous.

2. Process according to claim 1, in which another step is included between the ionic implantation step and the heat treatment step, in which the substrate is rigidly bonded on the side of the said region that will form the thin film, with a stiffener.

3. Process according to claim 1, in which ionic implantation is done using hydrogen ions or rare gas ions.

4. Process according to claim 1, in which the said mechanical forces are bending and/or tension forces.

5. Process according to claim 1, in which the said mechanical forces are applied during the heat treatment step.

6. Process according to claim 1, in which the said mechanical forces are applied after the heat treatment step.

7. Process according to claim 1, in which the said masking means consist of a layer deposited on the said face of the substrate.

8. Process according to claim 1, in which the substrate is made of silicon, the transistor is a MOS transistor and the said lower area is the gate oxide layer and the channel area of this MOS transistor, the upper area comprises the polysilicon gate of the MOS transistor deposited on the gate oxide layer.

9. Process according to claim 1, in which the masking means also comprise a resin layer.

10. Process according to claim 1, in which the masking means also comprise spacers deposited on the flanks of the gate.

* * * * *